(12) United States Patent
Schulz

(10) Patent No.: US 7,666,559 B2
(45) Date of Patent: Feb. 23, 2010

(54) STRUCTURE AND METHOD FOR DETERMINING AN OVERLAY ACCURACY

(75) Inventor: Bernd Schulz, Radebeul (DE)

(73) Assignee: GlobalFoundries, Inc., Grand Caymand (KY)

( * ) Notice: Subject to any disclaimer, the term of this patent is extended or adjusted under 35 U.S.C. 154(b) by 0 days.

(21) Appl. No.: 12/101,439

(22) Filed: Apr. 11, 2008

(65) Prior Publication Data

US 2009/0087756 A1   Apr. 2, 2009

(30) Foreign Application Priority Data

Sep. 29, 2007  (DE) ................. 10 2007 046 850

(51) Int. Cl.
*G03F 9/00* (2006.01)
(52) U.S. Cl. ............... 430/22; 430/5; 430/30; 257/48; 257/618; 257/797; 438/975
(58) Field of Classification Search ............ 430/5, 430/22, 30; 257/48, 618, 797; 438/975
See application file for complete search history.

(56) References Cited

U.S. PATENT DOCUMENTS

| | | | | |
|---|---|---|---|---|
| 6,921,916 | B2 * | 7/2005 | Adel et al. ............... | 257/48 |
| 2005/0195398 | A1 | 9/2005 | Adel et al. ............... | 356/401 |
| 2007/0008533 | A1 | 1/2007 | Ghinovker ............... | 356/401 |
| 2007/0058169 | A1 | 3/2007 | Ausschnitt et al. ........ | 356/401 |
| 2007/0096094 | A1 | 5/2007 | Levinski et al. .......... | 257/48 |

FOREIGN PATENT DOCUMENTS

JP   2004252313 A   9/2004

OTHER PUBLICATIONS

Translation of Official Communication from German Patent Office for German Patent Application No. 10 2007 046 850.6 dated Jul. 31, 2008.

\* cited by examiner

*Primary Examiner*—Christopher G Young
(74) *Attorney, Agent, or Firm*—Williams, Morgan & Amerson, P.C.

(57) ABSTRACT

An enhanced technique for determination of an alignment accuracy involves an overlay target assembly which comprises at least two targets, each target having a first sub-structure of a first layer and a second sub-structure of a second layer, wherein, when the first layer and the second layer are correctly aligned, the first sub-structure and the second sub-structure of at least one of the targets are offset with respect to each other by a programmed offset and the overlay target assembly is invariant to at least one geometric transformation. If the offset vectors which describe the offset between the first sub-structure and the second sub-structure all have the same norm, the overlay error may be determined without calibration. Redundancy may be increased by providing each target with two or more programmed offsets between elements of the first sub-structure and elements of the second sub-structure.

20 Claims, 9 Drawing Sheets

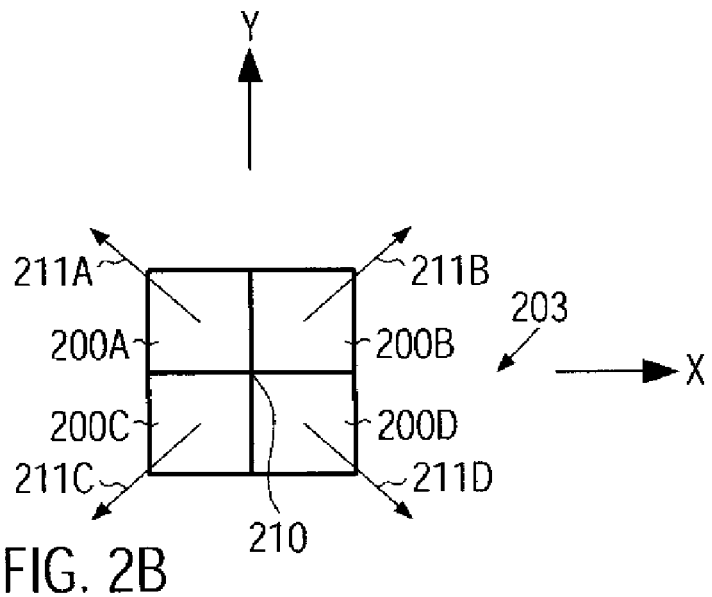
FIG. 2B
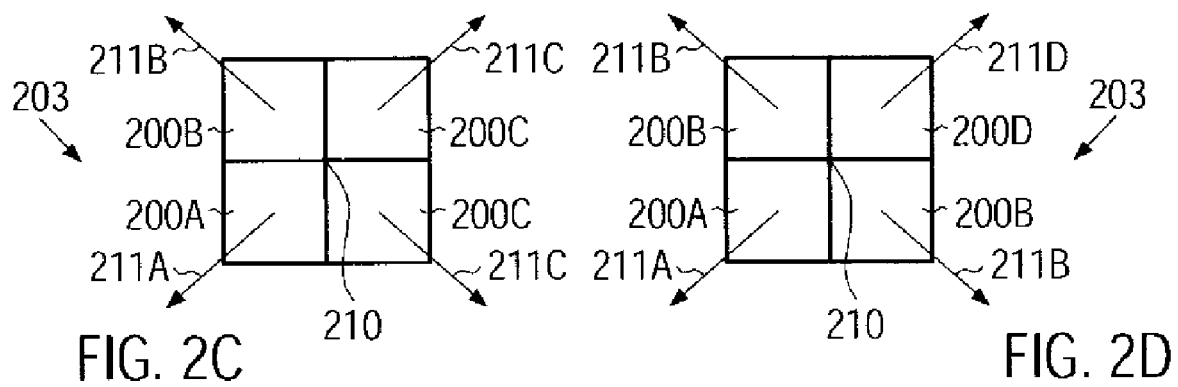
FIG. 2C
FIG. 2D

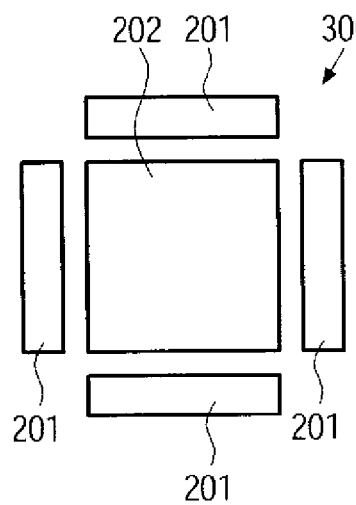
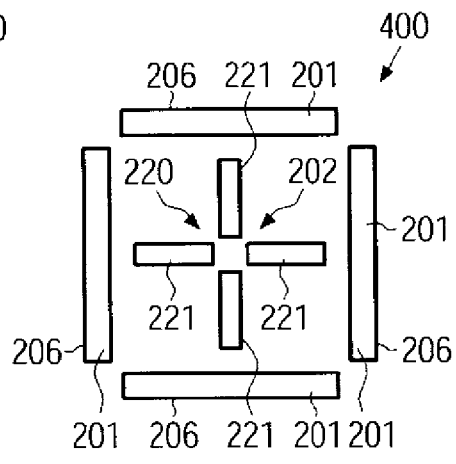
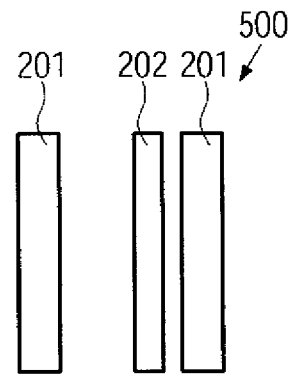
FIG. 3  FIG. 4  FIG. 5
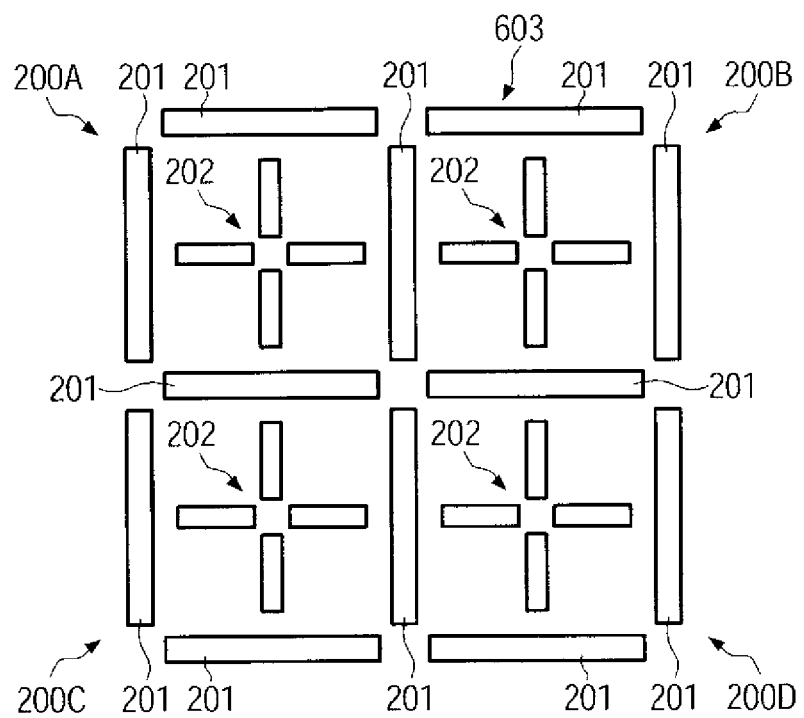
FIG. 6

STRUCTURE AND METHOD FOR DETERMINING AN OVERLAY ACCURACY

BACKGROUND OF THE INVENTION

1. Field of the Invention

The present subject matter generally relates to the field of fabrication of integrated circuits, and, more particularly, to a structure and a method for determining an overlay accuracy, that is, an alignment accuracy, between two layers of a multi-layered device.

2. Description of the Related Art

In the semiconductor industry, there is a continuing trend toward higher device densities. To achieve these high densities, there has been and continues to be efforts towards scaling down device dimensions. Hence, the fabrication of microstructures, such as integrated circuits, requires tiny regions of precisely controlled size to be formed in a material layer over an appropriate substrate, such as a silicon substrate, a silicon-on-insulator (SOI) substrate or other suitable carrier materials. These tiny regions of precisely controlled size are generated by patterning the material layer by performing photolithography, etch, implantation, deposition, oxidation processes and the like. Typically, at least in a certain stage of the patterning process, a mask layer may be formed over the material layer to be treated to define the tiny regions. Generally, a mask layer may consist of or may be formed by means of a layer of photoresist that is patterned by a lithographic process. During the lithographic process, the resist may be spin-coated onto the wafer surface and then selectively exposed to ultraviolet radiation through a corresponding lithography mask, such as a reticle, thereby imaging the reticle pattern into the resist layer to form a latent image therein. After developing the photoresist, depending on the type of resist, positive resist or negative resist, the exposed portions or the non-exposed portions are removed to form the required pattern in the layer of photoresist. Since the dimensions of the patterns in sophisticated integrated circuits are steadily decreasing, the equipment used for patterning the device features have to meet very stringent requirements with regard to resolution and overlay accuracy, i.e., the alignment accuracy of the individual layers with respect to each other, of the involved fabrication processes. In this respect, resolution is considered as a measure for specifying the consistent ability to print minimum size images under conditions of pre-defined manufacturing variations. One important factor in improving the resolution is represented by the lithographic process, in which a pattern contained in the photo mask or reticle is optically transferred to the substrate via an optical imaging system. Therefore, great efforts are made to steadily improve optical properties of the lithographic system, such as numerical aperture, depth of focus and wavelength of the light source used. The quality of the lithographic systems and processes is extremely important in creating very small feature sizes.

Of at least comparable importance, however, is the accuracy with which an image can be positioned on the surface of the substrate. Typically, microstructures such as integrated circuits are fabricated by sequentially patterning material layers wherein features on successive material layers bear a spatial relationship to each other. Each pattern formed in subsequent material layers has to be aligned to a pattern formed in the previously patterned material layer within specified registration tolerances. Deviations from an ideal registration are caused by, for example, a variation of a photoresist image on the substrate due to non-uniformities in such parameters as resist thickness, temperature, exposure dose, time and developing conditions. Furthermore, non-uniformity of the etch processes may also lead to variations in the etched features. In addition, there exists an uncertainty in overlaying the image of the pattern of the current material layer to the etched or otherwise defined pattern of the previously formed material layer while photolithographically transferring the image of the photo mask onto the substrate. Several factors contribute to the inability of the imaging system to perfectly overlay two layers, such as imperfections within a set of masks, temperature differences at the different times of exposure and limited registration capability of the alignment tool. As a result, the dominant criteria for determining the minimum feature size that may finally be obtained are the resolution for creating features in the individual substrate layers and the total overlay error to which the above-explained factors, in particular the lithographic processes, contribute.

Therefore, it is essential to steadily monitor the resolution, i.e., the capability of reliably and reproducibly creating the minimum feature size, also referred to as critical dimension (CD), within a specific material layer, and to steadily determine the overlay accuracy of patterns of material layers that have been successively formed and that have to be aligned to each other.

Conventional overlay metrology systems facilitate determining whether two layers lie within the acceptable tolerances. There are two main functions of overlay metrology regarding fabrication of integrated circuits: monitoring performance of lithographic alignment procedures and assisting in setup of a lithography process. For example, overlay metrology may be utilized with a sample wafer to assess overlay performance of a wafer lot. Moreover, overlay measurements may be utilized to optimally configure a stepper system prior to operation, and may later be employed to maintain optimal stepper performance via periodic overlay evaluation. In overlay metrology, two independent structures, that is, one structure in each layer to be printed, are formed by the specified manufacturing processes. The overlay error may be determined by measuring the displacement between the centers of symmetry of the two independent structures. As independent structures, frequently so-called box-in-box marks are used which are concentrically patterned in each of the layers. The displacement of the structures may be measured in units of pixels of a charge coupled device (CCD) onto which the concentric alignment marks are imaged during the measuring process.

For ever-decreasing feature sizes of microstructures, however, the detection of a displacement and thus the quantification of an overlay error between both overlay marks on the basis of edge finding routines may no longer be adequate. Therefore, recently, so-called advanced imaging metrology (AIM) marks are increasingly used to enhance overlay metrology reliability. AIM marks exhibit a periodic structure, thereby enabling utilization of highly powerful metrology techniques. Hence, increased performance of the overlay metrology may be obtained by using periodic overlay marks. With decreasing feature sizes, however, a discrepancy between overlay characteristics within a single die and the significant larger overlay marks may be observed, thereby rendering measuring data obtained from the target less reliable. The overlay marks are typically located in the scribe line of the substrate, i.e., in a region between dies empty of circuitry. One reason for the discrepancy between overlay characteristics within a single die resides in the fact that the lithography tool may image fine structures, as are typically found within a die, such as gate electrodes, shallow trench isolation (STI) structures and the like, in a different manner compared to relatively large structures, which are typically used to form overlay marks. This pattern and size-dependent phenomenon is called pattern placement error (PPE). Consequently, the pattern placement error has to be quantified in order to correct the results of the overlay measurements obtained from the overlay marks within a scribe line with respect to the contribution to actual microstructural features within the die. The pattern placement error may be conveniently measured by so-called simultaneous AIM overlay marks, as will be described in more detail below.

An overlay measurement structure in the form of an AIM mark comprises a periodic structure which may enable the measurement of an overlay error in at least two independent directions. The overlay measurement structure may be formed according to the following process flow. A first periodic structure may be formed in a corresponding device layer, such as a layer receiving STI trenches. It should be appreciated that a selection of respective sequences of material layers is arbitrary and the principles of the formation of the overlay measurement structure may be correspondingly applied to any front end or back end process sequence involving a photolithography step for patterning a further material layer on top of one or more previous layers. A pattern according to the first periodic structure may be imaged by photolithography into a corresponding resist layer that is formed above the substrate under consideration. After the development of the resist layer, a corresponding well-approved sequence of manufacturing steps including anisotropic etch techniques, deposition techniques, chemical mechanical polishing (CMP) and the like may be performed in order to form the corresponding patterns and also the (first) periodic structures. Thereafter, a process sequence may be performed for forming microstructure features of a second layer on the previously patterned layer, such as gate electrode structures, polysilicon lines and the like. Hence, a plurality of well-established oxidation and deposition processes may be carried out, such as the formation of a thin gate insulation layer and the subsequent deposition of a gate electrode material and the like, followed by a further photolithography process for patterning the structure, thereby simultaneously forming a second periodic structure. As previously pointed out, the individual lines and spaces of the first and second periodic structures may not be formed in accordance with the same design rules, but may be patterned in accordance with metrology requirements so as to enhance the detection of any offset between the first and second periodic structures. Thus, the pitch of the first and second periodic structures may be significantly larger compared to any critical dimension of actual device features formed within the die regions. Consequently, an overlay accuracy with respect to the x- and y-directions may be estimated with moderately high precision for the overlay measurement structure itself, but may not permit a precise estimation of the overlay accuracy within actual die regions having formed therein structural features of significantly less critical dimensions compared to dimensions in the overlying measurement structure. Therefore, in addition to the overlay structure, the so-called simultaneous AIM overlay marks are frequently used, in which at least some of the features of the periodic structures contain a fine structure formed in accordance with the respective design rules for actual device features in the die regions.

As previously explained, due to the pattern placement error, a corresponding shift may be detected in the form of an apparent overlay error, and this measure may be used for assessing the contribution of the pattern placement error within a die region to obtain a measure for correcting the actual overlay error between two different device layers measured by the overlay measurement structure. Thus, during the measurement of sophisticated micro-structural devices, at least two overlay measurement structures have to be provided.

The positioning of the overlay measurement structure in the scribe lines of a wafer is based on the assumption of an overlay model with linear field dependence. However, recent studies have indicated that the discrepancies from field linearity may no longer be negligible for sophisticated overlay control requirements, e.g., at 65 nm technology. For example, scanner lens distortion differences and reticle registration are known as major contributors to intrafield overlay errors. Therefore, for sophisticated applications, it may be necessary to insert design-rule-like metrology structures into locations other than the scribe lines. Since standard size overlay structures are difficult to insert in the chip region and are not representative of the circuit pattern, overlay metrology targets of reduced size, so-called micro targets, appear to be appropriate. For example, the feasibility of measuring overlay using small targets of size between $1 \times 1$ μm and $3 \times 3$ μm total size has been demonstrated. The image asymmetry is used to measure the overlay error. With no noise in the signal, the response is linear, but noise causes the response of the image symmetry as a function of the overlay error to tail off for small overlay offsets. Therefore, it has been proposed to program an offset into the design of the targets so that the symmetry is always in the linear region of the response curve. Using more than one target, e.g., a group of three or four targets, with different programmed offsets of, e.g., 30 nm, 50 nm and 70 nm, allows checking of the linearity and estimating the robustness of the measurement.

FIG. 1A shows the layout of a single conventional micro target 100 of the so-called box in frame type. The target 100 comprises a first structure 101 which is formed in a reference layer and is generally frame-shaped. Within the first structure 101 is formed a second structure 102 which is generally box-shaped and is formed in a resist layer located above the reference layer. Further indicated in FIG. 1A is the left-side distance Gx1 between the first structure 101 and the second structure 102, as well as the right-side distance Gx2 between the two structures 101, 102 as well as the lower distance Gy1 and the upper distance Gy2 between the two structures 101, 102. As mentioned before, the two structures 101, 102 are not arranged symmetrically, but with a programmed offset. Having an offset Dx in x-direction, the right-side distance Gx2 and the left-side distance Gx1 is given by the following equations:

$$Gx1 = Gx0 + Dx$$

$$Gx2 = Gx0 - Dx$$

wherein Gx0 is the distance between the two structures without offset, i.e., in a configuration where the left-side distance equals the right-side distance. It should be mentioned that the gaps between the two structures, i.e., the left-side distance as well as the right-side distance, are smaller than the resolution of the measurement device. Hence, with the structure shown in FIG. 1A, no edge detection algorithm, but rather an asymmetry measurement, is performed.

Further, having a programmed offset DY in y-direction, the lower distance Gy1 and the upper distance Gy2 is given by the following equations:

$$Gy1 = Gy0 + DY$$

$$Gy2 = Gy1 - DY$$

wherein Gy0 is the distance between the two structures without offset, i.e., in a configuration where the lower distance equals the upper distance.

The overall dimension S of the target 100 shown in FIG. 1A is 3 μm. The width W1 of bars forming the first substructure 101 is 250 nm. The distance Gx0 and Gy0 is 150 nm.

FIG. 1B shows an overlay target assembly 103 having four targets with different programmed offsets. A first target 100A has offsets DX=DY=50 nm. A second target 100B has offsets DX=DY=70 nm. A third target 100C has offsets DX=DY=30 nm, and a fourth target 100D has offsets equal to the offsets of the first target, that is, DX=DY=50 nm. The target assembly 103 is located in a chip region 104. The distance among the targets 100A, 100B, 100C, 100D, as well as the distance between the targets 100A, 100B, 100C, 100D and the chip region 104, are of a certain magnitude D, e.g., D=2 μm. FIG. 1C shows the offset vectors OV1, OV2, OV3, OV4 of the targets 100A, 100B, 100C, 100D. FIG. 1D shows the target assembly 103 in a configuration after a 90 degree rotation compared to the configuration of FIG. 1C. FIG. 1E shows the target assembly 103 of FIG. 1C in a vertically flipped configuration. Usually, a metrology tool used to measure the overlay measures the wafer in only one predefined orientation. Therefore, the measurement recipe has to be adopted for target assemblies which have been rotated or mirrored in the layout, assuming the metrology tool software is flexible enough to handle targets with different directions of the offset vectors.

The present disclosure is directed to various methods and systems that may avoid, or at least reduce, the effects of one or more of the problems identified above.

SUMMARY OF THE INVENTION

Generally, the present disclosure is directed to a technique that enables the evaluation of positional errors during the formation of microstructural features, such as integrated circuits and the like, wherein, in some illustrative embodiments, a measurement algorithm and recipe setup may be simplified compared to conventional techniques, while at the same time, in some illustrative embodiments, the amount of position information obtained during a single measurement event may be increased. For this purpose, a overlay target structure is provided that is invariant to a geometric transformation, for instance, rotation about a predetermined angle or reflection, enabling, in an illustrative embodiment, to obtain information about positioning errors within a predefined measurement site that may be accessed during a single measurement cycle. The overlay target structure may include an overlay target assembly comprising at least two targets. Herein, "reflection" denotes a mathematical map that transforms an object under consideration, e.g., the target structure, into its mirror image, whereas a rotation of an object about a predetermined angle relates to a rotation of the object about a rotation axis.

One illustrative overlay target structure for determining an alignment accuracy of a first layer and a second layer of a multi-layered device comprises a first sub-structure of a first layer and a second sub-structure of a second layer, wherein, when the first layer and the second layer are correctly aligned, the first sub-structure and the second sub-structure are offset with respect to each other. Further, the overlay target structure is invariant to at least one transformation selected from rotation about a predetermined angle and reflection.

An illustrative overlay target assembly for determining alignment accuracy of a first layer and a second layer of a multi-layer device comprises at least two targets. Each target comprises a first sub-structure of the first layer and a second sub-structure of a second layer. When the first layer and the second layer are correctly aligned, the first sub-structure and the second sub-structure of at least one of the targets are offset with respect to each other by a programmed offset. Further, the overlay target assembly is invariant to at least one transformation selected from rotation about the predetermined angle and reflection. One illustrative semiconductor device comprises an overlay target assembly or an overlay target structure as disclosed above.

An illustrative method comprises forming an overlay target assembly comprising at least two targets, each target having a first sub-structure of a first layer and a second sub-structure of a second layer, wherein, when the first layer and the second layer are correctly aligned, the first sub-structure and the second sub-structure of at least one of the targets are offset with respect to each other by a programmed offset and the overlay target assembly is invariant to at least one transformation selected from rotation about a predetermined angle and reflection. The method further comprises determining an alignment accuracy between the first layer and the second layer from a spatial relationship of the first sub-structure and the second sub-structure of the at least two targets.

BRIEF DESCRIPTION OF THE DRAWINGS

The disclosure may be understood by reference to the following description taken in conjunction with the accompanying drawings, in which like reference numerals identify like elements, and in which:

FIGS. 2B-2D show offset vectors of the target assembly of FIG. 2a in different configurations;

FIGS. 3-5 schematically show overlay targets in accordance with further illustrative embodiments disclosed herein;

FIGS. 6-8 schematically show target assemblies in accordance with the subject matter disclosed herein.

Figure 1A:
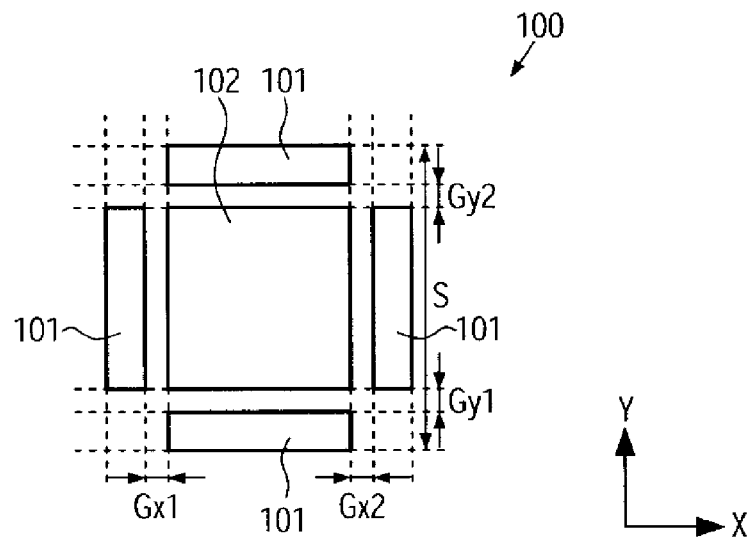
FIG. 1A schematically shows an elevated view of a conventional micro overlay target.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

If not specified otherwise, specific configurations of an overlay target assembly described hereinafter refer to a state where the first layer and the second layer are correctly aligned. Herein, the term "correctly aligned" relates to a spatial relationship between the first layer and the second layer which has no deviation from an optimal alignment. It should be understood that this optimal alignment is of theoretical nature and will hardly be achieved. Usually, in the production process of a semiconductor device, an actual alignment of the two layers will be accepted if it is within allowable tolerances with regard to the optimal alignment.

Generally, the present subject matter provides an overlay measurement structure with improved functionality. The overlay measurement structure, according to the subject matter disclosed herein, may provide information on overlay accuracy and/or pattern placement error and/or grid distortion and the like. According to illustrative embodiments, the improved measurement structure may also consume less space on a substrate. The overlay measurement structure or overlay target structure according to the subject matter disclosed herein may be disposed in a chip region of a semiconductor device (so-called "in-chip configuration").

Generally, a first aspect of the subject matter disclosed herein relates to an overlay target structure for determining an alignment accuracy of a first layer and a second layer of a multi-layer device. The overlay target structure comprises a first sub-structure of the first layer and a second sub-structure of the second layer. The overlay target structure is configured such that, when the first layer and the second layer are correctly aligned, the first sub-structure and the second sub-structure are offset with respect to each other and the overlay target structure is invariant to at least one geometric transformation. A geometric transformation may be, for example, rotation about a predetermined angle. A further example of a geometric transformation is reflection.

According to a second aspect of the subject matter disclosed herein, an overlay target structure may be an overlay target assembly comprising at least two targets wherein each target has a first sub-structure of the first layer and a second sub-structure of the second layer. When the first layer and the second layer are correctly aligned, the first sub-structure and the second sub-structure of at least one of the targets are offset with respect to each other by a programmed offset and, further, the overlay target assembly is invariant to at least one geometric transformation, e.g., geometric transformation as mentioned above. The overlay target structure or target assembly according to the subject matter disclosed herein is designed contrary to the design rules of conventional target structures. For example, in the conventional 2×2 target array shown in FIG. 1B, in each of the four targets 100A, 100B, 100C, 100D, a different programmed offset may be used. Although the size of the offset vector OV1, OV2, OV3, OV4 may vary in the existing arrays, the direction of the offset vectors (defined by the DX and DY and their signs) is always the same for all four targets. This means that the resulting structure of the complete 2×2 array is not fully symmetrical with respect to rotation or reflection. In complex logic device designs, entire blocks of the layer are often copied and pasted with additional geometrical operations like rotation and reflection in between. Due to the lack of symmetry in the existing array, the assignment of the offsets to the individual targets in each quadrant will change. The metrology tool normally measures the wafer only in one predefined orientation of the notch. Consequently, the measurement recipe has to be adopted for the arrays which were rotated or mirrored in the layout. This would require a tool software that is flexible enough to handle targets with different directions of offset vectors. Further, this would require that the information about all arrays and their individual properties are available up-front to the metrology engineer.

According to the subject matter disclosed herein, the overlay target structure is substantially invariant to at least one geometric transformation. According to an illustrative embodiment, the target structure or the target assembly is fully symmetrical with respect to rotation about at least one predetermined angle and/or reflection. According to an illustrative embodiment, this may be accomplished by using only one offset size for all four quadrants, wherein the offset vectors of each quadrant point either to the outside or to the center of the array. Because of the symmetry of the array, the inner exclusion zone may be eliminated, which helps reduce the overall array size. The metrology tool software, as well as the recipe setup, will be significantly simpler compared to the conventional array of micro overlay target structure.

Figure 1B:
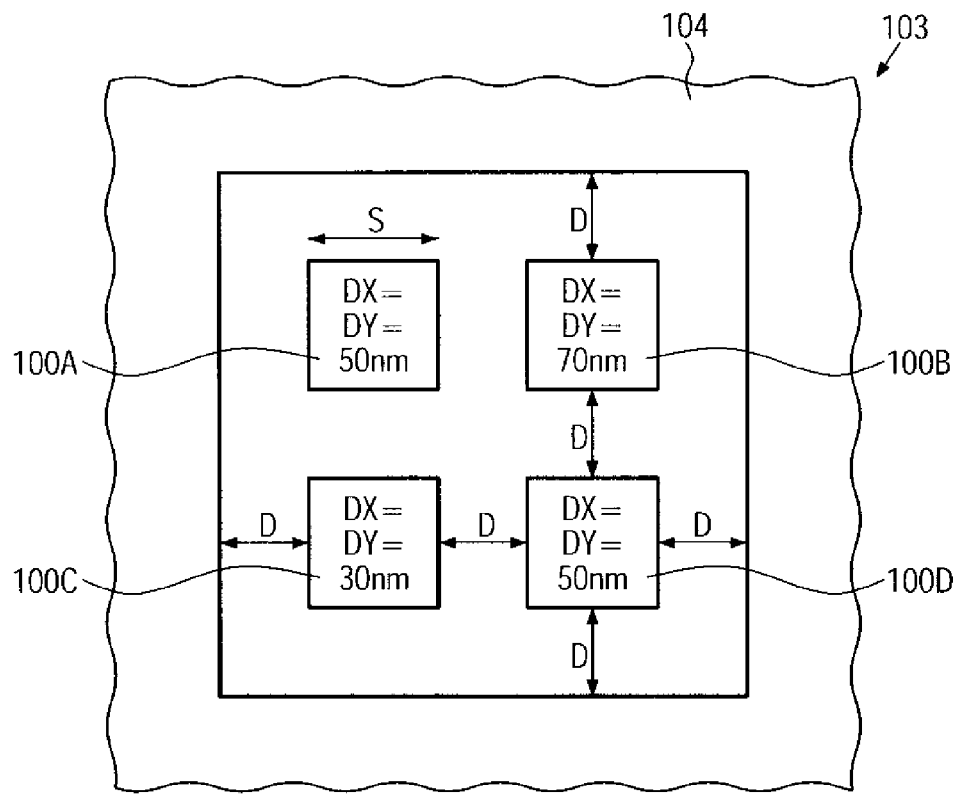
FIG. 1B schematically shows a conventional micro target assembly.
Figure 1C:
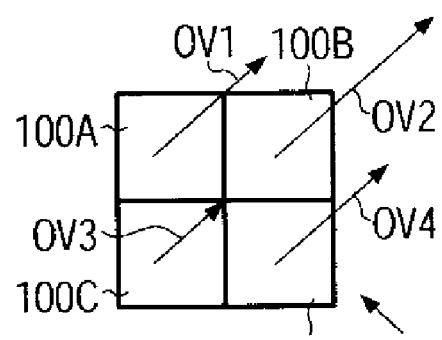
FIGS. 1C-1E schematically show programmed offset vectors of the target assembly of FIG. 1b in different configurations.
Figure 1D:
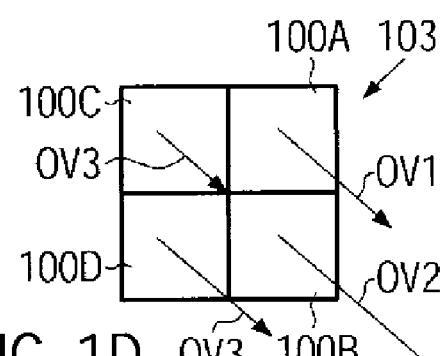
Figure 1E:
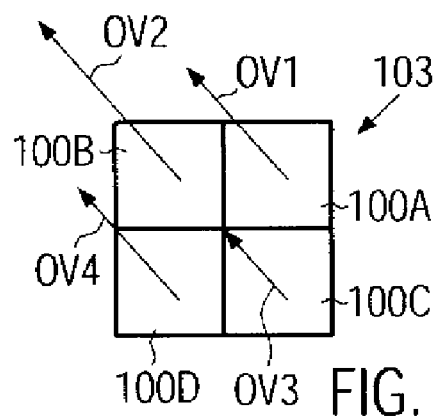

The principle of overlay measurement on the conventional kind of micro overlay target shown in FIG. 1B is based on the linear behavior of the (unsigned) asymmetry metric calculated from the intensity profile of the target image, where the individual structures, and especially the gaps in between, are smaller than the resolution limit of the imaging optic. Because of the indirect nature of the measurement method, a calibration of the response to the true overlay value is always required. This is also the reason why, in the conventional 2×2 array, at least three different programmed offset values are used. With the knowledge of the programmed offset for each target, the overlay error may be calculated easily. Since the algorithm for evaluating an overlay error from the asymmetry of the target provides only a linear response to overlay which is insensitive to the direction of the overlay error, it requires at least one additional test structure and an additional calculation step in the analysis procedure to produce true overlay error values.

For the new proposed target array in accordance with illustrative embodiments disclosed herein, wherein the target comprises only one programmed offset, the asymmetry metric is calculated in the same way as before with one difference. The metric result of the left (or respectively lower) quadrant will be multiplied by the factor of (−1). With this modification, it can be shown that the true overlay error may now be calculated based on the asymmetry metrics of all four quadrants without the further need for calibration.

Figure 2A:
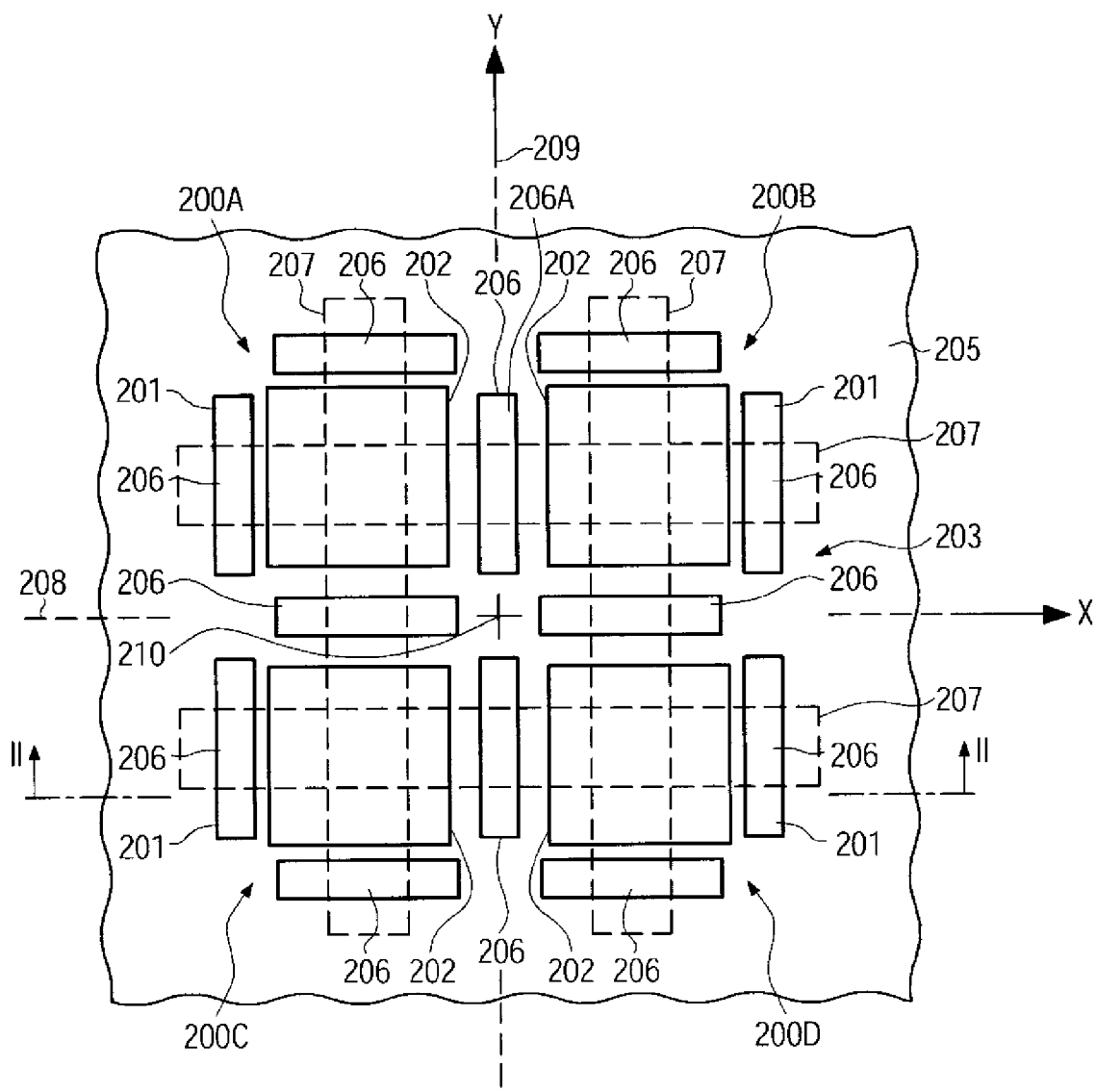
FIG. 2A schematically shows a target assembly in accordance with illustrative embodiments disclosed herein.

FIG. 2A schematically shows a top view of a target assembly 203, which may be located in or at a semiconductor device, a micromechanical device, a micro-optical device, or any combination thereof. The device 205 may be formed by any appropriate processes, e.g., processes which are common to micromechanical and/or microelectronic device manufacturing. The device 205 comprises a target assembly 203 which is formed according to illustrative embodiments of the subject matter disclosed herein. The target assembly 203 is formed by the same processes as the device 205. Hence, the target assembly 203 may be formed in accordance with well-established process techniques used for the fabrication of actual microstructural features, such as circuit elements of integrated circuits. During this well-established process flow, a correspondingly-designed photo mask is provided, including a corresponding pattern for the target assembly 203, so as to locate the target assembly 203 within the device region of the device 205.

The target assembly 203 comprises four targets 200A, 200B, 200C, 200D, each of which has a first sub-structure 201 and a second sub-structure 202. The first sub-structure 201 is generally frame-shaped, having four elements 206 which are arranged to surround the second substructure 202. According to an illustrative embodiment, the elements 206 of the first sub-structure 201 which are located between two second sub-structures of two different targets are shared by both targets. For example, the element 206A, which is located between the second sub-structures 202 of a first target 200A and a second target 200B, is a common element of the first sub-structures 201 of these targets 200A, 200B. This allows for a very compact target assembly design. According to other illustrative embodiments, each target in a target assembly has its own, separated structures without common elements. According to some illustrative embodiments, the individual elements 206 of the first sub-structure are spaced by a certain distance. According to other illustrative embodiments, the first sub-structure 201 is formed of a single element. For example, such a single element of the first sub-structure may be of rectangular shape. The first sub-structure 201 is part of a first layer, also denoted as reference layer herein. The second sub-structure 202 is part of a second layer. Such a second layer may be, for example, a resist layer, a mask layer or any other layer formed in accordance with the manufacturing process of the device 205.

In the configuration of the target assembly 203 which is shown in FIG. 2A, the first layer and the second layer, i.e., the first sub-structure 201 and the second sub-structure 202, are correctly aligned. In this configuration of correct alignment, the first sub-structure and the second sub-structure of all targets are offset with respect to each other by a programmed offset. According to an illustrative embodiment, wherein the first sub-structure 201 has a center of symmetry and the second sub-structure 202 has a center of symmetry, the centers of symmetry are offset by the programmed offset. According to another illustrative embodiment, when the first layer and the second layer are correctly aligned, the first sub-structure and the second sub-structure of at least one target are offset by the programmed offset so as to provide a predetermined asymmetry. As is well-documented in literature, the offset between the first sub-structure 201 and the second sub-structure 202 provides a linear response of the image symmetry on changes of the overlay error, see, for example, SPIE Volume 5752, pp. 438-448. According to an illustrative embodiment of the present subject matter, the symmetry of the image, F, is the smallest value of the root mean square difference of intensities at equal distances about any point "s" within the image, as is described in equation (1) (Ku et al, SPIE Vol. 6617, "In-chip Overlay Metrology for 45 nm Processes"):

$$f(s) = \sqrt{\frac{\int_{x_1}^{x_2} (I(s+x) - I(s-x))^2 dx}{x_2 - x_1}} \quad (1)$$

$$F = \min(f(s))$$

According to an illustrative embodiment, asymmetry of the target assembly 203 is measured for each individual quadrant of the 2×2 target assembly, i.e., the asymmetry is measured for each target 200A, 200B, 200C, 200D. Therefore, overlay is determined with redundancy, for two regions of interest 207 for each direction x, y. According to a further illustrative embodiment, each region of interest 207 includes two targets.

According to an illustrative embodiment, in a 2×2 target assembly, as illustrated in FIG. 2A, an upper left target 200A has an offset DX=−OS and DY=OS; an upper right target 200B has offsets of DX=OS and DY=OS; a lower left target 200C has offsets DX=−OS and DY=−OS; and a lower right target 200D has offsets DX=OS and DY=−OS. According to an illustrative embodiment, OS has a value of 50 nm. According to other embodiments, values of OS are between 10 nm and 80 nm, e.g., OS=30 nm or OS=70 nm. The terms "upper," "lower," "left" and "right" refer to the configuration of the targets as shown in FIG. 2A. While four targets are shown in the target assembly 203 in FIG. 2A, according to other illustrative embodiments, any suitable number of arrays may be arranged in an N×N array. According to an illustrative embodiment, the overlay target assembly 203 is invariant to reflection about a mirror axis 208 which extends in parallel to a row of the N×N array, that is in parallel to the X direction. According to a further illustrative embodiment, the overlay target assembly is invariant to reflection about the mirror axis 209 which extends in parallel to a column of the N×N array, that is in parallel to the Y axis in FIG. 2A. According to an illustrative embodiment, the targets 200A, 200B, 200C, 200D are arranged in quadrants of a Cartesian coordinate system spanned by an X-axis and a Y-axis, wherein said X-axis corresponds to said mirror axis 208 which extends in parallel to the row of the N×N array and the Y-axis corresponds to the mirror axis 209 which extends in parallel to the column of the N×N array. According to a further illustrative embodiment, the programmed offset of each target 200A, 200B, 200C, 200D is defined by a respective offset vector, and each offset vector is on a straight line running through an origin 210 of the Cartesian coordinate system.

FIG. 2B schematically shows the overlay target assembly 203 of FIG. 2A and the respective offset vectors 211A, 211B, 211C, 211D of the targets 200A, 200B, 200C, 200D in accordance with illustrative embodiments of the subject matter disclosed herein. According to an illustrative embodiment, the offset vectors of diametrical quadrants are point-symmetric with regard to the origin 210 of the Cartesian coordinate system. According to a further illustrative embodiment, each offset vector 211A, 211B, 211C, 211D encloses an angle of 45 degrees or a multiple thereof with the X-axis. According to a further illustrative embodiment, the offset vectors 211A, 211B, 211C, 211D of all targets 200A, 200B, 200C, 200D are of the same length, that is, the offset vectors of all targets of the overlay target assembly 203 have the same norm. According to a further illustrative embodiment, the overlay target assembly 203 is invariant to a rotation about 90 degrees as is shown in FIG. 2C, where the overlay target assembly 203 of FIG. 2B has been rotated about 90 degrees about the origin 210. According to a further illustrative embodiment, the overlay target assembly 203 is invariant to a rotation about 90 degrees about a center of symmetry of the overlay target assembly 203. According to a further illustrative embodiment, the overlay target assembly 203 is invariant to a rotation about 180 degrees about the center of symmetry or about the origin of the Cartesian coordinate system. In the overlay target assembly 203 shown in FIG. 2A, the origin 210 of the Cartesian coordinate system falls on the center of symmetry of the overlay target assembly 203. FIG. 2D shows the overlay target assembly 203 of FIG. 2A in a vertically flipped configuration, that is, in a configuration where the overlay target assembly 203 of FIG. 2A has been mirrored about the mirror axis 208.

Figure 2E:
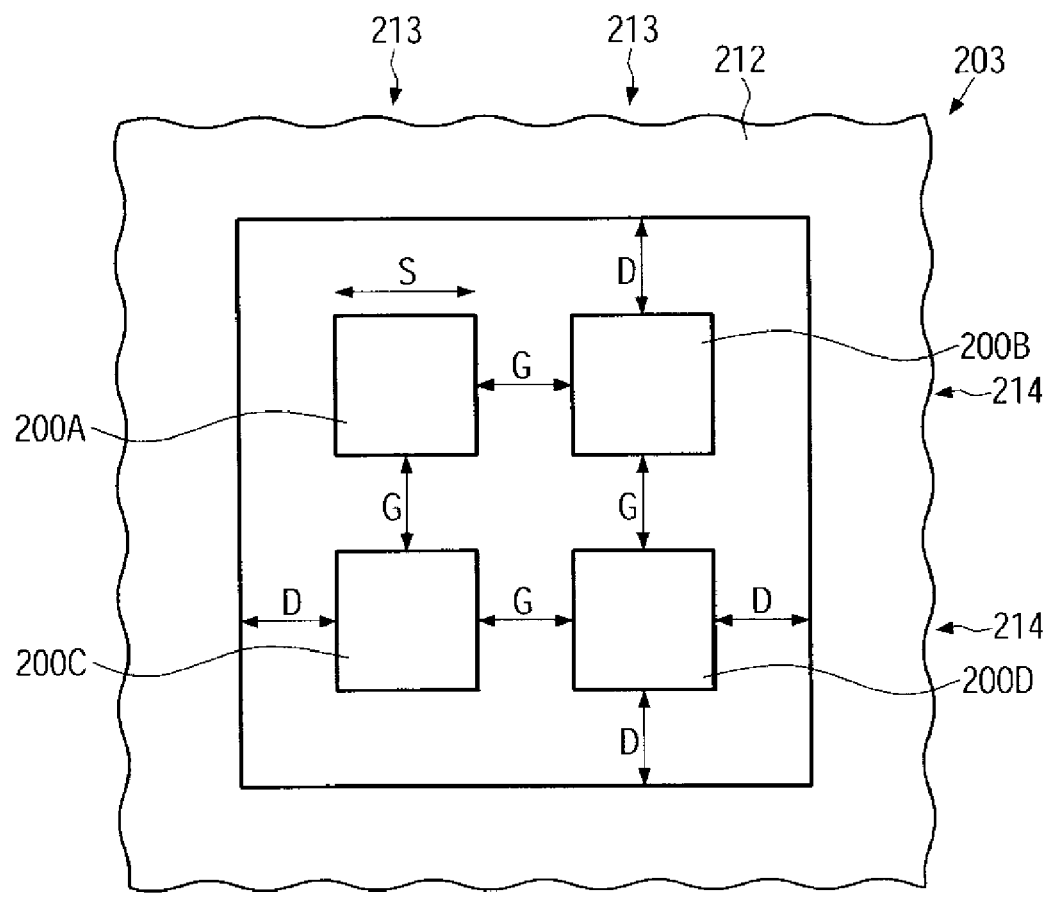
FIG. 2E shows a target assembly in accordance with further illustrative embodiments.

FIG. 2E shows the overlay target assembly 203 in accordance with further illustrative embodiments disclosed herein. In accordance with an illustrative embodiment, the overlay target assembly 203 is located in a device region 212 of the device 205. According to a further illustrative embodiment, the individual targets 200A, 200B, 200C, 200D are spaced from the device region 212 by a distance D. In accordance with an illustrative embodiment, the columns 213 of the targets 200A, 200B, 200C, 200D are spaced by a distance G. According to a further illustrative embodiment, the rows 214 of the targets 200A, 200B, 200C, 200D are spaced by the same distance G as the columns 213. According to a further illustrative embodiment, the columns 213 are spaced from each other by a distance different from a distance between the rows 214. According to a further illustrative embodiment, the distance between the columns 213 and rows 214 of the targets 200A, 200B, 200C, 200D is zero. An example for such a configuration is shown in FIG. 2A, where the targets share common elements 206.

Figure 2F:
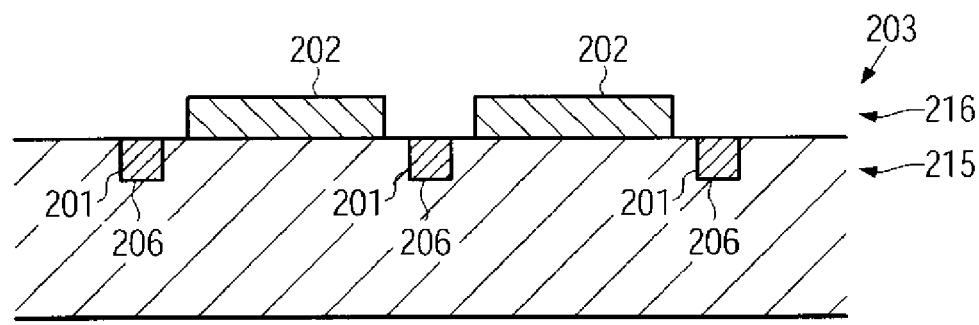
FIG. 2F shows a cross-sectional view of the target assembly of FIG. 2a along the line II-II.

FIG. 2F schematically shows a cross-sectional view according to the intersection line depicted in FIG. 2A. The first sub-structure 201 is located and formed of a first layer 215 and the second sub-structure 202 is located and formed of a second layer 216. The overlay target assembly 203 may be formed in accordance with well-established process techniques used for the fabrication of actual microstructural features, such as circuit elements of integrated circuits. During this well-established process flow, a correspondingly designed photo mask is provided including a corresponding pattern for the overlay target assembly 203, as is, for instance, shown in FIG. 2A, so as to locate the overlay target assembly 203 within the device 205. For example, during a first manufacturing sequence, the first layer 215, which also corresponds to a first device layer, may be formed, for instance, by using photolithography, etch techniques, deposition techniques, implantation techniques, planarization techniques and the like, and thereafter the second layer 216, which corresponds to a second device layer, may be formed, wherein a photolithography sequence is to be performed, thereby aligning the microstructural features and also the features of the overlay target assembly 203, that is, the first sub-structure and the second sub-structure. Thereafter, the overlay target assembly 203 may be subjected to an overlay measurement procedure as will be described in more detail with reference to FIG. 2G.

Figure 2G:
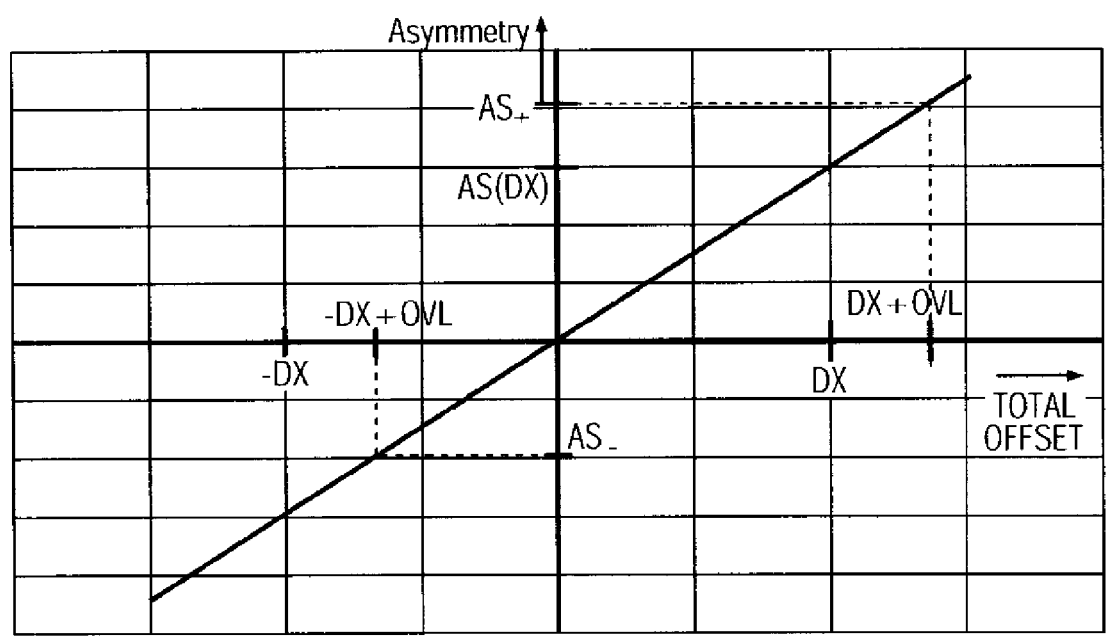
FIG. 2G schematically shows the asymmetry of the targets 200B and 200C of FIG. 2A versus the respective total offset.

FIG. 2G shows the asymmetry versus the total offset between the first sub-structure and the second sub-structure for a configuration of the programmed offset vectors 211A, 211B, 211C, 211D as depicted in FIGS. 2B-2D. Herein, the total offset is the sum of the programmed offset and the overlay error between the first sub-structure 201 and the second sub-structure 202. The total offset in FIG. 2G is depicted for an X-direction. However, it should be understood that the same consideration as follows below may also be taken for the Y-direction of the overlay target assembly 203. The asymmetry shown in FIG. 2G may be any appropriate measure for the symmetry of the overlay target assembly 203 which depends on the overlay error. A measure for the symmetry of the overlay target assembly 203 may be determined as described above with regard to equation (1) and as well documented in literature.

Having regard to FIG. 2G, for a programmed offset DX, an asymmetry AS(DX) is obtained. Having an overlay error OVL, an asymmetry value $AS_+$ is obtained. According to an illustrative embodiment, by definition, the unsigned (positive) asymmetry value of the left (respectively lower) quadrant is always multiplied by $(-1)$, that is:

$$AS(+DX) = -AS(-DX) \qquad (2)$$

As will be shown in the following, this allows a determination of the overlay error without calibration. The asymmetry of each quadrant may be expressed by the following equations. Due to the symmetric design, the equations may be applied for the Y direction respectively.

$$AS_- = AS(-DX+OVL) = m^*(-DX+OVL) \qquad (3)$$

$$AS_+ = AS(+DX+OVL) = m^*(+DX+OVL) \qquad (4)$$

Where equation (3) describes the symmetry response of the left quadrant and equation (4) describes the symmetry response of the right quadrant. Having two equations and two unknowns, the scaling factor $m^*$ may be eliminated:

$$OVL = DX * \frac{AS(+DX+OVL) + AS(-DX+OVL)}{AS(+DX+OVL) - AS(-DX+OVL)} \qquad (5)$$

wherein for OVL=0:

$$AS(+DX+0) + AS(-DX+0) = 0$$

$$AS(+DX+0) - AS(-DX+0) \neq 0 \qquad (6)$$

Since two regions of interest (ROI) 207 (see FIG. 2A) per direction may be analyzed, equations (3) and (4) may be calculated for each region of interest 207. Consequently, an average value of the symmetry responses from both regions of interest may be used in equation (5) for the final determination of the overlay error. Equation (5) may then be simplified in the following way, where $AS^*_+$ and $AS^*_-$ stand for the average values of the two quadrants:

$$OVL = DX * \frac{AS^*_+ + AS^*_-}{AS^*_+ - AS^*_-} \qquad (7)$$

The resulting, that is the measured, asymmetry $AS_+$ and $AS_-$ are indicated in FIG. 2G.

FIGS. 3-5 show targets in accordance with illustrative embodiments of the subject matter disclosed herein. FIG. 3 shows a box in frame target 300 which is similar to a box in frame target used in FIG. 2A. However, while in FIG. 2A two adjacent targets share a common element 206A, the target shown in FIG. 3 as a whole may be used to build up an overlay target assembly, for example, by arranging four (4) targets 300 in a manner as depicted in FIG. 2E. Besides the common element 206A, the target 300 corresponds to, for example, the target 200A of FIG. 2A, the detailed description of which is not repeated here.

According to an illustrative embodiment, inside the first sub-structure 201, geometrical elements different from the box 202 shown in FIG. 3 may be positioned inside the frame-like first sub-structure 201. For example, as shown in FIG. 4, a target 400 may comprise a second sub-structure in the form of a cross 220 positioned inside the frame formed up by the elements 206 of the first sub-structure 201. The second sub-structure in the form of cross 220 may be formed of a single continuous substructure or may be formed of individual elements 221 as shown in FIG. 4.

According to a further illustrative embodiment, as shown in FIG. 5, a target 500 may be formed of a one-dimensional structure. According to an illustrative embodiment, the one-dimensional structure has only a single symmetry axis (axis of reflection). For example, according to a further illustrative embodiment, the first sub-structure 201 comprises two parallel bars having at least one bar of the second sub-structure 202 arranged in parallel with the bars of the first sub-structure 201. According to a further illustrative embodiment, the bar of the second sub-structure 202 is located between two bars of the first sub-structure 201. According to an illustrative embodiment, the bars of the first sub-structure 201 have the same length. According to another illustrative embodiment, the bar of the second sub-structure 202 has the same length as at least one bar of the first sub-structure 201. According to still another illustrative embodiment, the bars of the first sub-structure 201 have a different length. According to still another illustrative embodiment, the length of the bar of the second sub-structure 202 is different from the length of the bars of the first sub-structure 201.

The dimensions of the targets disclosed herein and the dimensions of the first sub-structure 201 and the second sub-structure 202 may be chosen in accordance with the requirements and conditions of the respective application, such as feature size, measuring wavelength for the optical determination of the asymmetry of the target, etc. According to an illustrative embodiment, the respective dimensions of the targets according to the subject matter disclosed herein, except for the offset, may be similar as described with regard to the conventional target shown in FIG. 1A. According to an illustrative embodiment, the overall dimensions of the targets may be smaller than 4.5 µm. According to further illustrative embodiments, the overall dimensions of the target may be even smaller, e.g., 3 µm, 2 µm, 1 µm, or even less.

FIG. 6 shows an overlay target assembly 603 in accordance with illustrative embodiments of the subject matter disclosed herein. The overlay target assembly 603 has a first sub-structure 201 which is similar to the first sub-structure 201 of FIG. 2A. The second sub-structure 202 of each target 200A, 200B, 200C, 200D of the target assembly 603 is cross-shaped and may be formed as the second sub-structure 202 described with regard to the target 400 of FIG. 4.

Figure 7:
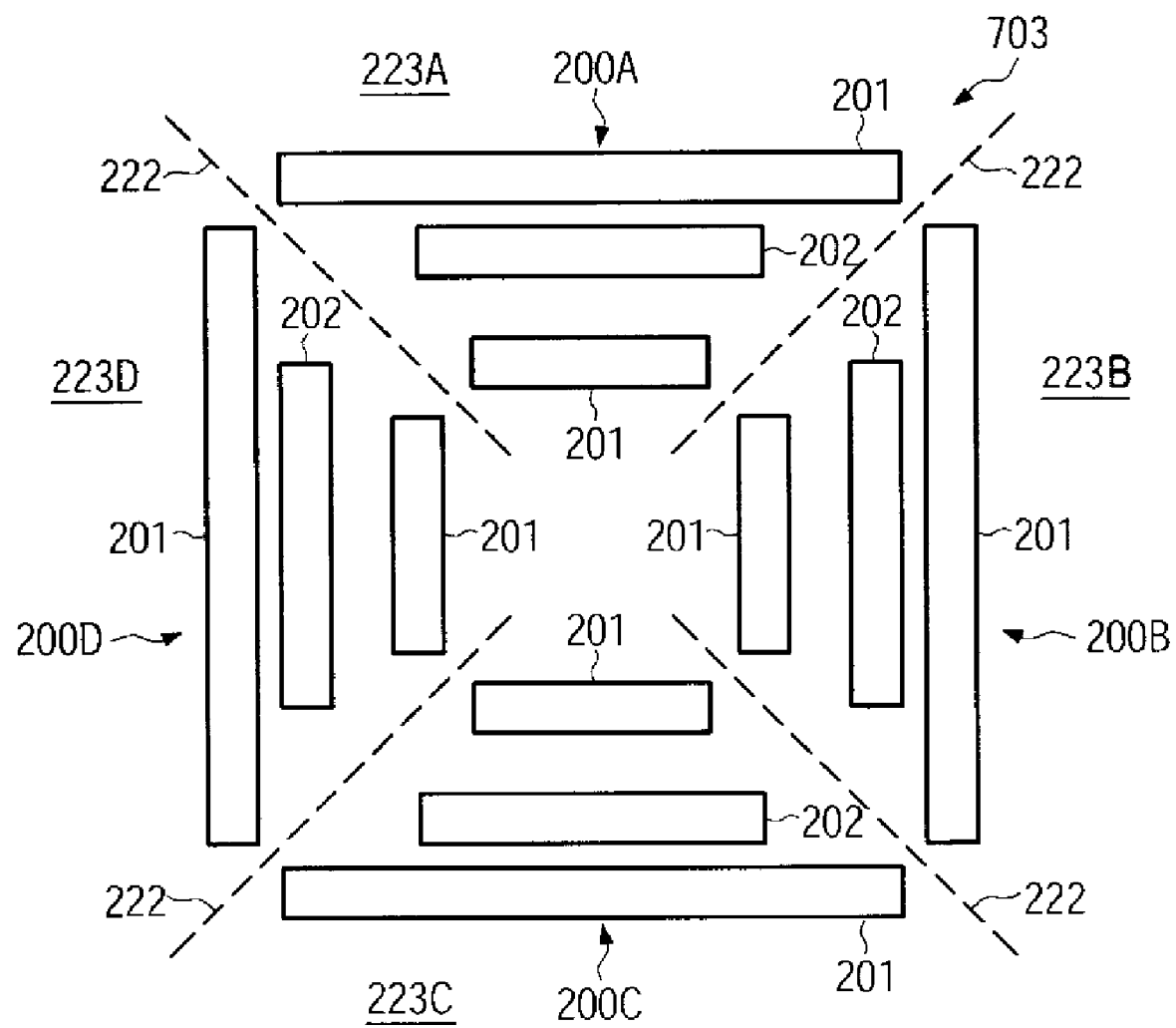

FIG. 7 shows an overlay target assembly 703 in accordance with illustrative embodiments of the subject matter disclosed herein. According to an illustrative embodiment, the individual targets 200A, 200B, 200C, 200D of the overlay target assembly 703 are not arranged in the form of an array but are rather arranged in sectors 223A, 223B, 223C, 223D. For example, a number of four sectors and hence of four targets 200A, 200B, 200C, 200D provides an overlay target assembly which is invariant to rotation about a predetermined angle of (360 degrees/4)=90 degrees. According to an illustrative embodiment, two such neighboring targets in two neighboring sectors may reproduce each other by reflection at a respective mirror axis 222. The design rule of positioning the individual targets 200A, 200B, 200C, 200D in the respective sectors 223A, 223B, 223C, 223D is suitable for a one-dimensional target of the kind shown in FIG. 5. However, according to other illustrative embodiments, two-dimensional targets of the kind as, for example, illustrated in FIGS. 3 and 4 may also be used with the design rule of positioning the targets in respective sectors of the overlay target assembly.

Figure 8:
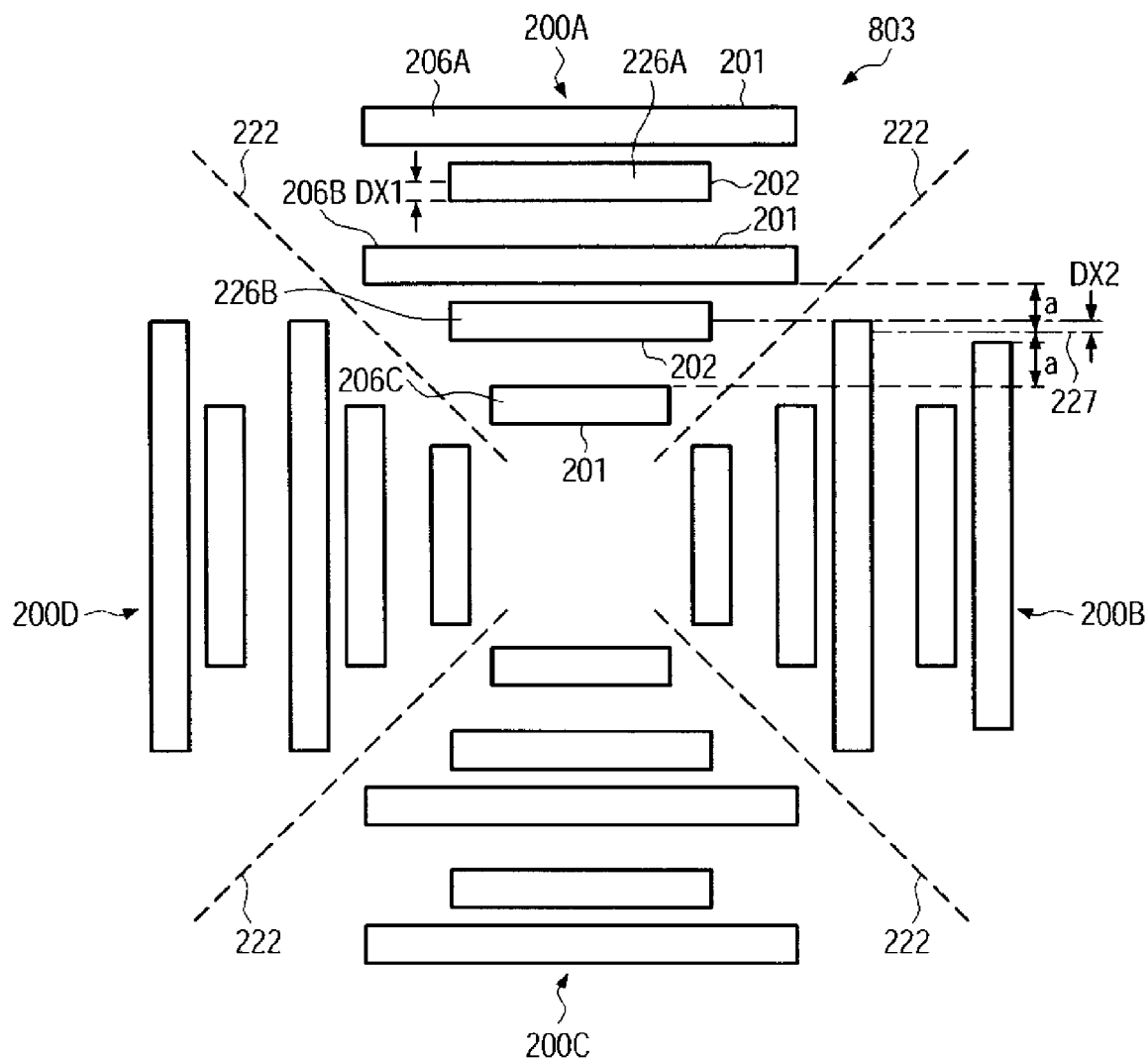

FIG. 8 shows an overlay target assembly in accordance with illustrative embodiments of the subject matter disclosed herein. The overlay target assembly 803 of FIG. 8 follows the same design rule as the overlay target assembly 703 of FIG. 7, the details of which are not repeated here. According to an illustrative embodiment, the overlay target assembly 703 comprises targets each of which has two or more programmed offsets.

In the following, the structure of one target 200A of the target assembly 803 is described in detail. However, it should be understood that, according to the design rule of the structure of FIG. 7, the four targets 200A, 200B, 200C, 200D are identical except for their orientation. Now, regarding the overlay target assembly 803, the first target 200A comprises a first sub-structure 201. In accordance with an illustrative embodiment, the first sub-structure 201 comprises three bars 206A, 206B, 206C which are arranged in parallel. According to an illustrative embodiment, the length of the bars is different and is reduced towards the center of the overlay target assembly 803. The overlay target assembly 803 comprises a second sub-structure 202. According to an illustrative embodiment, the second sub-structure comprises two bars 226A, 226B which are arranged in parallel. According to an illustrative embodiment, the bars 226A, 226B of the second sub-structure 202 are of the same length. According to a further illustrative embodiment, the bars of the second sub-structure are of different lengths. According to a further illustrative embodiment, the length of the bars of the second sub-structure decreases as the bars are located closer to the center of the overlay target assembly. According to an illustrative embodiment, each bar 226A, 226B of the second sub-structure 202 is located between two bars 206A, 206B and 206B, 206C, respectively, of the first sub-structure 201. According to an illustrative embodiment of the present subject matter, the bars 226A, 226B of the second sub-structure 202 are offset by different programmed offsets with regard to their neighboring bars of the first sub-structure. In particular, the first bar 226A of the second sub-structure is offset from the center line between the first bar 206A, 206B of the first sub-structure 201 by a first programmed offset DX1. A second bar 226B of the second sub-structure 202 is offset from a center line between the second bar 206B and a third bar 206C of the first sub-structure by a second offset DX2. The term "center line" herein refers to a line 227 the distance A of which from the neighboring bars of the first sub-structure 201 is equal. Using targets 200A, 200B, 200C, 200D which have two or more programmed offsets employed therein, the redundancy is increased. The total overlay error may be calculated as the average of the individual overlay errors for each programmed offset calculated according to equation (7).

According to other illustrative embodiments, the individual targets having two or more different programmed offsets employed therein may be two-dimensional, having a contrast variation in two dimensions.

As a result, the present subject matter provides an enhanced technique for obtaining efficient information with reduced measurement time in that the overlay target assembly comprises at least two targets, each target of which has a first sub-structure of a first layer and a second sub-structure of a second layer, wherein, when the first layer and the second layer are correctly aligned, the first sub-structure and the second sub-structure of at least one of the targets are offset with respect to each other by a programmed offset and the overlay target assembly is invariant to at least one geometric transformation. If the offset vectors which describe the offset between the first sub-structure and the second sub-structure all have the same norm, the overlay error may be determined without calibration. Redundancy may be increased by providing each target with two or more programmed offsets between elements of the first sub-structure and elements of the second sub-structure.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. An overlay target assembly adapted for use in determining an alignment accuracy of a first layer and a second layer of a multi-layered device, said assembly comprising:
   at least two targets, each target having a first sub-structure of said first layer and a second sub-structure of said second layer that cooperate to indicate overlay error in a predetermined direction;
   wherein, when said first layer and said second layer are correctly aligned:
   said first sub-structure and said second sub-structure of at least one of said targets are offset with respect to each other by a programmed offset defined by a difference between a first center point of the first substructure and a second center point of the second substructure in the predetermined direction; and
   said overlay target assembly is invariant to at least one transformation selected from rotation about a predetermined angle and reflection.

2. The overlay target assembly of claim 1, wherein when, said first layer and said second layer are correctly aligned, said first sub-structure and said second sub-structure of each of said at least two targets are offset with respect to each other by a respective programmed offset.

3. The overlay target assembly of claim 1, comprising at least four targets arranged in an n×n array.

4. The overlay target assembly of claim 3, wherein said overlay target assembly is invariant to reflection about a mirror axis which extends in parallel to a row or a column of said n×n array.

5. The overlay target assembly of claim 4, wherein:
   said targets are arranged in quadrants of a Cartesian coordinate system spanned by an x axis and a y axis, wherein said x-axis corresponds to said mirror axis which extends in parallel to said row of said n x n array and said y-axis corresponds to said mirror axis which extends in parallel to said column of said n×n array;
   said programmed offset of each target is defined by a respective offset vector; and
   each offset vector is on a straight line running through an origin of said Cartesian coordinate system.

6. The overlay target assembly of claim 5, wherein offset vectors of diametrical quadrants are point-symmetric with regard to the origin of the Cartesian coordinate systems.

7. The overlay target assembly of claim 5, wherein said offset vectors are of said same length.

8. The overlay target assembly of claim 1, wherein said overlay target assembly is invariant to a rotation about 90 degrees.

9. The overlay target assembly of claim 1, wherein said overlay target assembly is invariant to a rotation about 180 degrees.

10. The overlay target assembly of claim 1, wherein each target has a generally rectangular form.

11. The overlay target assembly of claim 1, wherein each target has a dimension smaller than 4.5 µm.

12. The overlay target assembly of claim 1, wherein said at least two targets are spaced equidistantly by a predetermined distance.

13. The overlay target assembly of claim 1, wherein at least one of said targets is a target having a single symmetry axis.

14. The overlay target assembly of claim 1, wherein of each target at least one of the first sub-structure and the second sub-structure has two or more symmetry axis.

15. The overlay target assembly of claim 1, wherein two neighboring targets share a common target element.

16. The overlay target assembly of claim 1, wherein said overlay target assembly is located on a semiconductor device.

17. The overlay target assembly of claim 16, wherein said overlay target assembly is located in a chip area comprising active elements of said semiconductor device.

18. An overlay target structure adapted for use in determining an alignment accuracy of a first layer and a second layer of a multi-layered device, said structure comprising:
   a first sub-structure of said first layer; and
   a second sub-structure of said second layer, wherein:
   the first and second sub-structures cooperate to indicate overlay error in a predetermined direction;
   when said first layer and said second layer are correctly aligned, said first sub-structure and said second sub-structure are offset with respect to each other defined by a difference between a first center point of the first sub-structure and a second center point of the second sub-structure in the predetermined direction; and
   said overlay target structure is invariant to at least one transformation selected from rotation about a predetermined angle and reflection.

19. A method, comprising:
   forming an overlay target assembly comprising:
   at least two targets, each target having a first sub-structure of a first layer and a second sub-structure of a second layer that cooperate to indicate overlay error in a predetermined direction;
   wherein, when said first layer and said second layer are correctly aligned:
   said first sub-structure and said second sub-structure of at least one of said targets are offset with respect to each other by a programmed offset defined by a difference between a first center point of the first sub-structure and a second center point of the second substructure in the predetermined direction; and
   said overlay target assembly is invariant to at least one transformation selected from rotation about a predetermined angle and reflection; and
   determining an alignment accuracy between said first layer and said second layer from a spatial relationship of said first sub-structure and said second sub-structure of said at least two targets.

20. The method of claim 19, wherein said alignment accuracy between said first layer and said second layer is determined on the basis of an image asymmetry of each individual target.

* * * * *